(12) United States Patent
Rocca

(10) Patent No.: US 10,412,486 B2
(45) Date of Patent: Sep. 10, 2019

(54) ELECTRONIC CIRCUIT FOR A MICROPHONE AND MICROPHONE

(71) Applicant: TDK Corporation, Tokyo (JP)

(72) Inventor: Gino Rocca, Copenhagen (DK)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 15/735,241

(22) PCT Filed: Jul. 27, 2015

(86) PCT No.: PCT/EP2015/067180
§ 371 (c)(1),
(2) Date: Dec. 11, 2017

(87) PCT Pub. No.: WO2017/016591
PCT Pub. Date: Feb. 2, 2017

(65) Prior Publication Data
US 2018/0184200 A1     Jun. 28, 2018

(51) Int. Cl.
*H04R 3/00* (2006.01)
*H03F 3/183* (2006.01)
*H03G 3/30* (2006.01)
*H03F 3/50* (2006.01)
*H04R 29/00* (2006.01)

(52) U.S. Cl.
CPC .............. *H04R 3/00* (2013.01); *H03F 3/183* (2013.01); *H03F 3/505* (2013.01); *H03G 3/3005* (2013.01); *H04R 3/007* (2013.01); *H04R 29/004* (2013.01); *H03F 2200/03* (2013.01); *H03F 2200/435* (2013.01); *H03F 2203/5015* (2013.01); *H03F 2203/5036* (2013.01); *H04R 2201/003* (2013.01); *H04R 2410/00* (2013.01)

(58) Field of Classification Search
None
See application file for complete search history.

(56) References Cited

U.S. PATENT DOCUMENTS 7,961,896 B1    6/2011  Shyu
2006/0147060 A1   7/2006  Shyu et al.
(Continued)

FOREIGN PATENT DOCUMENTS

DE      2061364 A1    6/1972
WO   WO 2014/023363 A1   2/2014

OTHER PUBLICATIONS

DE2061364 English Translation.*
(Continued)

*Primary Examiner* — James K Mooney
(74) *Attorney, Agent, or Firm* — Nixon Peabody LLP

(57) ABSTRACT

The electronic circuit having an input stage for pre-amplifying an electrical input signal of the electronic circuit provided by a transducer. The electronic circuit has an output stage for providing a microphone output signal by processing an output signal of the input stage. The electronic circuit has an adjustable output load arranged and configured for setting a current draw of the output stage. Additionally, the electronic circuit has a measurement circuit configured to capture the output signal of the input stage and an automatic control circuit configured to adjust the adjustable output load dependent on the captured output signal of the input stage.

13 Claims, 3 Drawing Sheets

(56) References Cited

U.S. PATENT DOCUMENTS

Figure 1:
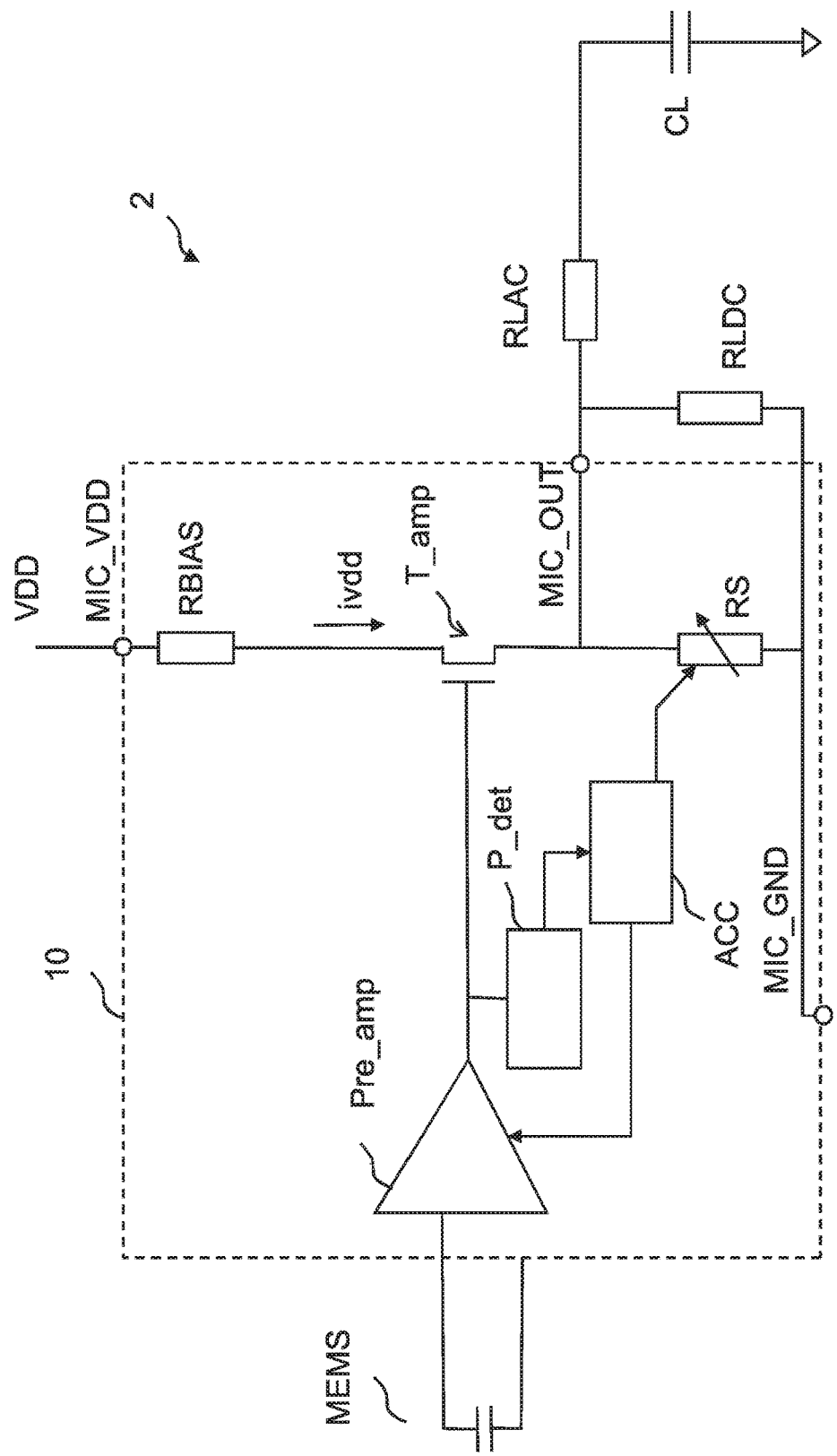

| | | |
|---|---|---|
| 2013/0051582 A1 | 2/2013 | Kropfitsch |
| 2013/0271307 A1 | 10/2013 | Kropfitsch |
| 2014/0010386 A1* | 1/2014 | Frohlich ................ H03F 3/185 |
| | | 381/120 |
| 2015/0016636 A1 | 1/2015 | Florian et al. |

OTHER PUBLICATIONS

European Patent Office, International Search Report in International Application No. PCT/EP2015/067180, dated Feb. 23, 2016 (4 pages).
European Patent Office, Written Opinion in International Application No. PCT/EP2015/067180, dated Feb. 23, 2016 (7 pages).

* cited by examiner

ELECTRONIC CIRCUIT FOR A MICROPHONE AND MICROPHONE

CROSS-REFERENCE TO RELATED APPLICATIONS

This application is a U.S. National Stage of International Application No. PCT/EP2015/067180, filed Jul. 27, 2015, which is incorporated herein by reference in its entirety.

The invention relates to an electronic circuit for a microphone. In particular, the electronic circuit may be configured as an ASIC (application-specific integrated circuit). Furthermore, the present disclosure relates to a microphone comprising the electronic circuit. The microphone may be fabricated in MEMS (micro-electrical-mechanical systems) technology.

For various applications, microphones may be operated in a two-terminal mode. In the two-terminal mode, power and output may be allocated to the same terminal. These microphones typically have higher distortion levels at relatively low sound pressure levels (SPL) in comparison to corresponding microphones operating in a three-terminal mode in which separate terminals for power, ground and output may be provided.

It is an object of the invention to provide an electronic circuit and a microphone with improved properties, in particular with a reduced distortion level at high sound pressure levels.

This object is achieved by the features of the independent claims. Advantageous embodiments of the invention are given in the sub-claims.

According to a first aspect, the invention is distinguished by an electronic circuit for a microphone. The electronic circuit comprises an input stage for pre-amplifying an electrical input signal of the electronic circuit provided by a transducer. Furthermore, the electronic circuit comprises an output stage for providing a microphone output signal by processing an output signal of the input stage. The electronic circuit comprises an adjustable output load arranged and configured for setting a current draw of the output stage. Additionally, the electronic circuit comprises a measurement circuit configured to capture the output signal of the input stage and an automatic control circuit configured to adjust the adjustable output load dependent on the captured output signal of the input stage.

This has the advantage that the microphone can be used for high sound pressure levels of 130 dB SPL and above, in particular in a two-wire application. The use is not limited to sound pressure levels of 110-120 dB SPL or lower.

This allows for adjusting the current consumption and the total harmonic distortion (THD) performance of the microphone. Typically the main factor limiting the use of a microphone, in particular a 2-wire microphone, is the output stage. The output stage may be a class A amplifier with low quiescent current levels. Such amplifiers comprise high distortion levels already at low sound pressure levels, for instance 10% THD at 110-115 dB SPL.

For reaching higher sound pressure levels the output load is adjusted. For sound pressure levels below a given threshold and for a given value of the output load the output stage draws a specific current. Higher sound pressure levels cause higher THD levels of the output stage. Therefore, in the case the sound pressure level exceeds the given threshold, the value of the output load is reduced such that the current drawn by the output stage increases. The increased current moves, for instance, the 10% THD point to a higher sound pressure level.

According to an embodiment of the first aspect, the electronic circuit is operable in a two-terminal mode and comprises a first terminal (MIC_VDD) configured for microphone output and power supply or ground. In the two-terminal mode power supply, microphone output and ground may be allocated to two terminals. The two-terminal mode allows for reduced or minimal wiring, lower production costs and/or less chip area.

According to a further embodiment of the first aspect, the electronic circuit comprises a second terminal for ground, a third terminal and a two-terminal mode configuration network coupled to the third terminal and/or coupled in parallel to the output load. The two-terminal mode configuration network may be used to adjust a target sensitivity of the microphone.

According to a further embodiment of the first aspect, the two-terminal mode configuration network comprises at least one adjustable circuit element. This allows for a flexible adjustment of the target sensitivity. For instance, the adjustment may be performed on the customer side. In this way a wide variety of requirements may be covered by one microphone version.

According to a further embodiment of the first aspect, a gain of the input stage is adjustable. This allows for a flexible adjustment of the target sensitivity and further parameters, e. g. current consumption, signal-to-noise ratio etc.

According to a further embodiment of the first aspect, the automatic control circuit is configured to adjust the gain of the input stage and/or at least one impedance value of the respective adjustable circuit elements of the two-terminal mode configuration network. This allows for a flexible and cost-effective adjustment of the target sensitivity and/or further parameters.

According to a further embodiment of the first aspect, the two-terminal mode configuration network comprises at least one adjustable on-chip resistor. In this way the operation of the electronic circuit in the two-wire mode may require no or fewer external discrete components. PCB area may be saved. Furthermore tolerances and variations, in particular of resistors, can be compensated. Preferably, the electronic circuit is configured as an ASIC, the adjustable resistors being integrated in the ASIC. This allows reducing the required space of the electronic circuit. The integrated resistors may only add little to the area. Furthermore, by integrating the resistor in the electronic circuit, in particular the ASIC, the sensitivity variation of the microphone, which may arise due to tolerances of external components, may be reduced.

According to a further embodiment of the first aspect, the two-terminal mode configuration network comprises a first resistor arranged in parallel to a second resistor, wherein the first resistor is connectable in series with a capacitor. In this way the target sensitivity can be reached over a wide frequency range, in particular from DC to high frequencies.

According to a further embodiment of the first aspect, the measurement circuit comprises a peak detector. This allows for a cost-effective production of the electronic circuit. The peak detector may make use of one or more given thresholds. In case the peak detector detects that the sound pressure value exceeds the given threshold, the automatic control circuit coupled to the peak detector reduces the value of the output load for increasing the current draw of the output stage. If more thresholds are defined, the automatic control circuit may set the current in more steps improving for instance the 10% THD point further.

According to a further embodiment of the first aspect, the adjustable load comprises an adjustable resistor. In this way the current draw of the output stage can easily be adjusted.

According to a further embodiment of the first aspect, the adjustable load comprises a switchable resistor array. This allows for a cost-effective production of the electronic circuit.

According to a further embodiment of the first aspect, the output stage comprises a transistor amplifier allowing for a cost-effective production of the electronic circuit.

According to a further embodiment of the first aspect, the transducer is a differential transducer and/or the input stage is a differential-to-single ended input stage. In this way non-linearity effects of the transducer and/or the input stage may be eliminated or reduced.

According to a second aspect, the invention is distinguished by a microphone comprising a transducer (MEMS) and an electronic circuit according to the first aspect.

The electronic circuit may comprise any structural and functional features as described above. Features described with respect to the microphone are also disclosed herein with respect to the electronic circuit and vice versa, even if the respective feature is not explicitly mentioned in the context of the specific aspect.

According to an embodiment of the second aspect, the transducer is fabricated in micro-electrical-mechanical systems technology. The transducer may comprise a capacitor. In particular, an acoustical input signal may result in a change of capacitance of the transducer. Accordingly, the microphone may be a condenser or capacitor microphone. The transducer may comprise a diaphragm and one or more back-plates.

Figure 2:
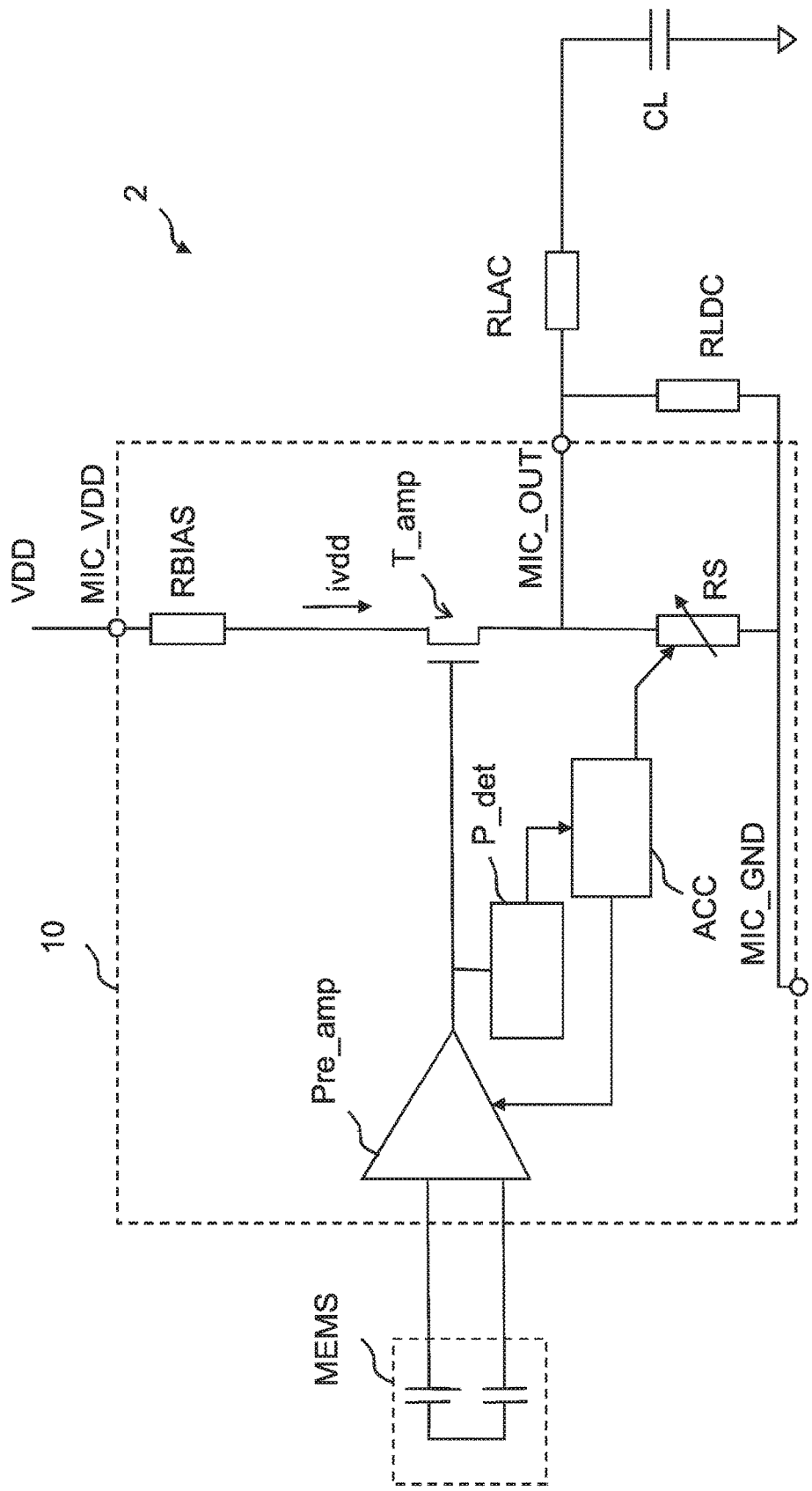

Further features, refinements and expediencies will become apparent from the following description of the exemplary embodiments in connection with the figures. These are as follows:

FIG. 1 a block diagram of a first exemplary embodiment of a microphone,

FIG. 2 a block diagram of a second exemplary embodiment of a microphone and

Figure 3:
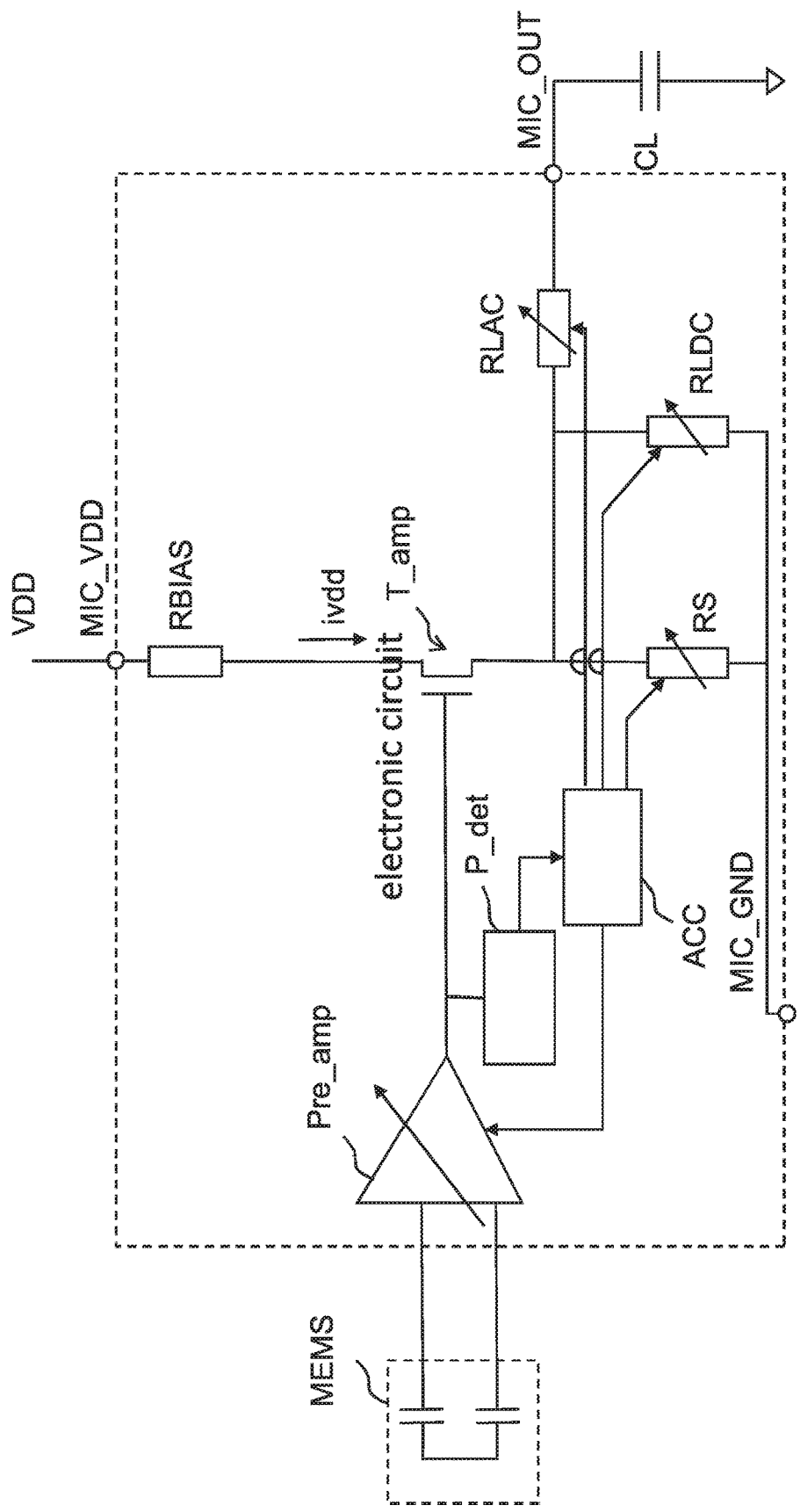

FIG. 3 a block diagram of a third exemplary embodiment of a microphone.

Elements of the same design and function that appear in different figures are identified by the same reference numerals.

FIG. 1 shows a block diagram of a first exemplary embodiment of a microphone 2. The microphone 2 comprises an electronic circuit 10.

Preferably, the electronic circuit 10 is an application-specific electronic circuit (ASIC). The electronic circuit 10 may be fabricated as a die.

The microphone 2 may comprise a transducer MEMS, in particular a micro-electro-mechanical systems transducer, for converting an acoustical input signal into an electrical signal. As an example, the transducer MEMS may comprise a semiconductor material such as silicon or gallium arsenide. The transducer MEMS may comprise a diaphragm and one or more back-plates. As an example, the distance between the diaphragm and a back-plate may be in a range of 1 μm to 10 μm.

In FIG. 1 the transducer MEMS is exemplarily configured as a single-ended transducer.

The microphone 2 may comprise a transducer die and the ASIC die comprising the electronic circuit 10. The shown electronic circuit 10 may also be used with other transducers than a micro-electro-mechanical systems transducer. The microphone 2 may be used in a headset, for example.

The transducer MEMS is electrically connected to the electronic circuit 10. In particular, the electronic circuit 10 may process an electrical signal of the transducer MEMS.

The electronic circuit 10 comprises an input stage Pre_amp and an output stage T_amp, an adjustable output load RS, a measurement circuit P_det, and an automatic control circuit ACC. An input of the input stage Pre_amp is coupled to a first connection of the transducer MEMS for receiving the electrical signal of the transducer MEMS.

The output stage T_amp is configured and arranged to receive an output signal of the input stage Pre_amp. The output stage T_amp may comprise a transistor 20, which may function as a transistor amplifier.

The measurement circuit P_det is configured and arranged to measure an output signal of the input stage Pre_amp. The measurement circuit P_det may comprise a peak detector.

The adjustable output load RS may be configured so that the output stage T_amp draws different levels of current depending on the sound pressure level.

The automatic control circuit ACC is arranged and configured to adjust the output load RS dependent on the output signal of the input stage Pre_amp, in particular dependent on a measurement result of the measurement circuit P_det.

The adjustable output load RS may comprise an adjustable resistor. The adjustable output load RS may comprise a switchable resistor array, and the automatic control circuit ACC may be configured to control a switch-setting of the switchable resistor array.

Furthermore, the electronic circuit 10 may provide the transducer MEMS with a bias voltage, which is not shown in detail in FIG. 1.

The electronic circuit 10 may be operable in a two-terminal mode and may comprise a first terminal MIC_VDD configured for microphone output and power supply.

A resistor RBIAS may be located in the connection between the first terminal MIC_VDD and the power supply VDD. The resistor RBIAS is connected in series to the power supply VDD.

The electronic circuit 10 comprises a second terminal MIC_GND for connecting the electronic circuit 10 to ground. The transducer MEMS may also be connected to ground.

The microphone 2 may comprise a two-terminal mode configuration network coupled to a third terminal MIC_OUT and/or coupled in parallel to the output load RS.

The two-terminal mode configuration network may comprise a first resistor RLAC and a second resistor RLDC. In the two-terminal mode two resistors RLAC, RLDC may be used in order to adjust a sensitivity of the microphone 2. The first resistor RLAC may be arranged in series to a capacitor CL. The second resistor RLDC may be arranged in parallel to the first resistor RLAC and the capacitor CL.

Preferably, the capacitor CL may not be part of the electronic circuit 10 and may be arranged eternally on a PCB. The capacitor CL may be configured as a discrete component.

The first resistor RLAC and/or second resistor RLDC may also not be part of the electronic circuit 10 and may be arranged externally on a PCB. The first resistor RLAC and second resistor RLDC may be configured as discrete components. Such an approach offers high flexibility in view of adjusting the sensitivity and provides the advantage of minor variations in sensitivity as process tolerances do not play any role in this case.

Without an applied signal and for sound pressure levels below a given threshold (for example 105 db SPL), and for given values of the output load RS (for example 30 kOhm), for the first resistor RLAC (for example 2 kOhm) and for the second resistor RLDC (for example 15 kOhm), the output stage T_amp draws a current Ivdd of 50 μA and the two-wire operation mode sensitivity may be about 44 dBV. In this configuration the microphone 2 may reach the 10% THD level when the sound pressure level reaches a given limit (for example 100 dB SPL).

When a sound pressure level larger than the given threshold is detected by the measurement circuit P_det, the automatic control circuit ACC reduces the value of the output load RS and, as a result, the current Ivdd running into the output stage T_amp is increased.

Changing the DC current in the output stage T_amp may cause glitches during the current switching. Preferably the electronic circuit 10 comprises a circuit (glitch eater circuit) to suppress the glitches on the microphone output.

FIG. 2 shows a block diagram of a second exemplary embodiment of the microphone 2.

In this case the transducer MEMS is configured as a differential transducer and the input stage Pre_amp is configured as a differential-to-single-ended input stage Pre_amp. With such a configuration higher sound pressure levels may be reached as other sources of non-linearity, for example a non-linearity of the transducer MEMS and/or the input stage Pre_amp, may be compensated.

FIG. 3 shows a block diagram of a third exemplary embodiment of the microphone 2.

In comparison to FIG. 1 or 2, the first resistor RLAC and the second resistor RLDC are part of the electronic circuit 10 and may be arranged on the same die as the electronic circuit 10.

Preferably, the first resistor RLAC and/or second resistor RLDC and/or a gain of the input stage Pre_amp are adjustable and the automatic control circuit ACC is configured to adjust the gain of the input stage Pre_amp and/or at least one impedance value of the respective adjustable circuit elements of the two-terminal mode configuration network.

In the case the current Ivdd is changed, the resulting change in sensitivity may be compensated by reconfiguring the first resistor RLAC and/or second resistor RLDC and/or input stage Pre_amp, and the sensitivity may be kept constant.

Thereby, the spread of the sensitivity in the two-wire mode may be reduced. This spread may arise not only from the resistors but also from the overall spread of the microphone sensitivity. Thus, the total spread can be reduced. In particular, a sensitivity adjustment can be achieved by tuning the first resistor RLAC and second resistor RLDC. Furthermore, also the current consumption and the THD performance of the microphone 2 may be adjusted, in particular by tuning the output load RS and the gain of the input stage Pre_amp.

REFERENCE NUMERALS 2 microphone
10 electronic circuit
ACC automatic control circuit
CL capacitor
Ivdd current of the output stage
MEMS transducer
MIC_GND second terminal
MIC_OUT third terminal
MIC_VDD first terminal
P_det measurement circuit
Pre_amp input stage
RBIAS resistor
RLAC first resistor
RLDC second resistor
RS output load
T_amp output stage
VDD power supply

The invention claimed is:

1. An electronic circuit for a microphone, the electronic circuit comprising:
   an input stage for pre-amplifying an electrical input signal of the electronic circuit provided by a transducer, wherein a gain of the input stage is adjustable,
   an output stage for providing a microphone output signal by processing an output signal of the input stage, wherein the output stage includes a transistor amplifier with a gate coupled to an output of the pre-amplifying input stage,
   an adjustable output load arranged and configured for setting a current draw of the output stage, wherein the output load is coupled with a source of the transistor amplifier of the output stage,
   a measurement circuit coupled to the output of the pre-amplifying input stage and capturing the output signal of the input stage and
   an automatic control circuit adjusting the adjustable output load and a gain of the input stage dependent on the captured output signal of the input stage.

2. The electronic circuit of claim 1, wherein the electronic circuit is operable in a two-terminal mode and comprises a first terminal configured for
   microphone output and
   power supply or ground.

3. The electronic circuit according to claim 1, wherein the electronic circuit comprises
   a second terminal for ground,
   a third terminal and
   a two-terminal mode configuration network coupled to the third terminal and/or coupled in parallel to the output load.

4. The electronic circuit of claim 3, wherein the two-terminal mode configuration network comprises at least one adjustable circuit element.

5. The electronic circuit according to claim 3, wherein the two-terminal mode configuration network comprises at least one adjustable on-chip resistor.

6. The electronic circuit according to claim 3, wherein the two-terminal mode configuration network comprises a first resistor arranged in parallel to a second resistor, wherein the first resistor is connectable in series with a capacitor.

7. The electronic circuit according to claim 3, wherein the two-terminal mode configuration network comprises one or a plurality of adjustable circuit elements and the automatic control circuit is configured to adjust an impedance value of the single adjustable circuit element of the two-terminal mode configuration network or at least one impedance value of the plurality of adjustable circuit elements of the two-terminal mode configuration network.

8. The electronic circuit according to claim 1, wherein the measurement circuit comprises a peak detector.

9. The electronic circuit according to claim 1, wherein the adjustable output load comprise an adjustable resistor.

10. The electronic circuit according to claim 1, wherein the adjustable output load comprises a switchable resistor array.

11. The electronic circuit according to claim 1, wherein the transducer is a differential transducer.

12. A microphone comprising the electronic circuit according to claim 1 and comprising the transducer.

13. The microphone of claim 12, wherein the transducer is fabricated in micro-electro-mechanical systems technology.

* * * * *